United States Patent [19]

Nishimori et al.

[11] Patent Number: 5,187,397
[45] Date of Patent: Feb. 16, 1993

[54] INTEGRATED SEMICONDUCTOR CIRCUIT WITH IMPROVED BOOST OPERATION SPEED

[75] Inventors: Miki Nishimori; Teruo Seki, both of Kasugai, Japan

[73] Assignee: Fujitsu Limited, Kawasaki, Japan

[21] Appl. No.: 853,296

[22] Filed: Mar. 18, 1992

[30] Foreign Application Priority Data

Mar. 18, 1991 [JP] Japan .................................. 3-051874

[51] Int. Cl.⁵ ..................... H03K 17/687; H03K 19/01
[52] U.S. Cl. ..................................... 307/578; 307/482; 307/296.2; 307/264
[58] Field of Search ............ 307/482, 578, 246, 296.2, 307/264, 443, 296.8

[56] References Cited

U.S. PATENT DOCUMENTS

| | | | |
|---|---|---|---|
| 3,983,414 | 9/1976 | Stafford et al. | 307/578 |
| 4,092,548 | 5/1978 | Beilstein et al. | 307/482 |
| 5,010,259 | 4/1991 | Inoue et al. | 307/578 |
| 5,039,882 | 8/1991 | Arakawa | 307/296.2 |

Primary Examiner—William L. Sikes
Assistant Examiner—Toan Tran
Attorney, Agent, or Firm—Staas & Halsey

[57] ABSTRACT

An integrated semiconductor circuit has a boost circuit that may improve boost operation speed. The boost circuit employs a P-channel type transistor as a driver. The back gate of the P-channel type transistor is connected to a charge-up circuit so that the back gate may be charged to a predetermined level before a boost signal is applied to the driver.

6 Claims, 4 Drawing Sheets

INTEGRATED SEMICONDUCTOR CIRCUIT WITH IMPROVED BOOST OPERATION SPEED

BACKGROUND OF THE INVENTION

1. Field of the Invention

The present invention relates to an integrated semiconductor circuit. More specifically, the invention relates to means for providing back-bias for P-channel type transistor in a boost circuit.

2. Description of the Related Art

Conventionally, semiconductor memories and so forth of integrated semiconductor circuits and so forth employ a boost circuit for producing a voltage higher than potential voltage for the purpose of signal wave shaping and so forth. The boost circuit is also employed in a substrate potential generating circuit, active pull-up circuit and so on.

FIG. 3 shows one typical example of the boost circuit.

The boost circuit 5 includes a N-channel type transistor 1 having the drain and the gate connected to a high potential power source, such as Vcc, and a P-channel type transistor 2 having the source connected to the source of the N-channel type transistor 1, the drain d connected to an output 4, and the gate connected to an input signal source. The node section N between of the N-channel type transistor 1 and the P-channel type transistor 2 is connected to the output of a boost signal generating means 3.

In boost circuit 5, the P-channel type transistor 2 serves as a driver.

In the prior art, as shown in FIG. 3, the back gate BG of the P-channel type transistor is connected to the node section N so that the back gate bias becomes equal to the drain voltage of the N-channel type transistor and thus the P-channel type transistor is prevented from falling into a positive bias state to thereby cause a malfunction.

The boost signal generating means 3 generally comprises an appropriate oscillation means or a buffer means 6 and an appropriate capacitative means 7 to generate a pulse form output as the boost signal. The boost signal thus generated is applied to the node section N to activate the P-channel type transistor 2 to set the potential of the output or a substrate 4 at a higher level than the potential power source, such as Vcc.

However, in the conventional boost circuit 5, the potential b at the node section N is initially maintained to be lower than Vcc for the corresponding magnitude to the threshold level Vth of the N-channel type transistor 2, i.e. Vcc−Vth, as shown in FIG. 4. The charge at the node section N by the boost signal has to charge the N well capacity of the P-channel type transistor. As a result, the rising gradient of the potential b at the node section N by the boost signal becomes relatively moderate so that, when the boost signal a is generated after switching the input signal level from "H" level to "L" level, an increase in the potential b at the node section N can be substantially delayed. Therefore, the timing to raise the potential d of the substrate 4 over Vcc can be delayed to slow-down the process speed of the integrated semiconductor circuit per se.

SUMMARY OF THE INVENTION

Therefore, it is an object of the present invention to solve the problems in the prior art and provide an integrated semiconductor circuit that can improve the rising speed of potential of a boosted signal for a P-channel type transistor in a boost circuit, and thus increase the process speed of the integrated semiconductor circuit.

In order to accomplish the above-mentioned object, there is provided, according to the present invention, an integrated semiconductor circuit employing a boost circuit for generating a voltage higher than the potential of a high potential power source; the boost circuit comprises a P-channel type transistor as a driver for driving a boosted signal(b) with a boost signal (a), and a charge-up means for charging up the back gate of the P-channel type transistor to a predetermined level in advance of the application of the boost signal to the P-channel type transistor.

The boost circuit in the integrated semiconductor circuit, according to the present invention, employs not only the boost signal similar to the conventional circuit, but also the charge-up means provided separately for directly charging a predetermined potential to the back gate of the P-channel type transistor. The charge-up of the back gate of the P-channel type transistor takes place so that the charge-up potential at the back gate increases to a level close to the high potential of the boosted signal in advance of the application of the boost signal to the boost circuit. By this, the capacity, in other words, the load, for the boost signal is reduced so that swift increase in the potential can be obtained in response to an input of the boost signal.

BRIEF DESCRIPTION OF THE DRAWINGS

The present invention will be more fully understood from the detailed description given herebelow and from the accompanying drawings of the preferred embodiments of the invention, which, however, should not be considered limited to the invention but are for explanation and understanding only.

In the drawings.

DESCRIPTION OF THE PREFERRED EMBODIMENT

The practical embodiments of an integrated semiconductor circuit according to the present invention will be discussed in detail with reference to the drawings.

Figure 1:
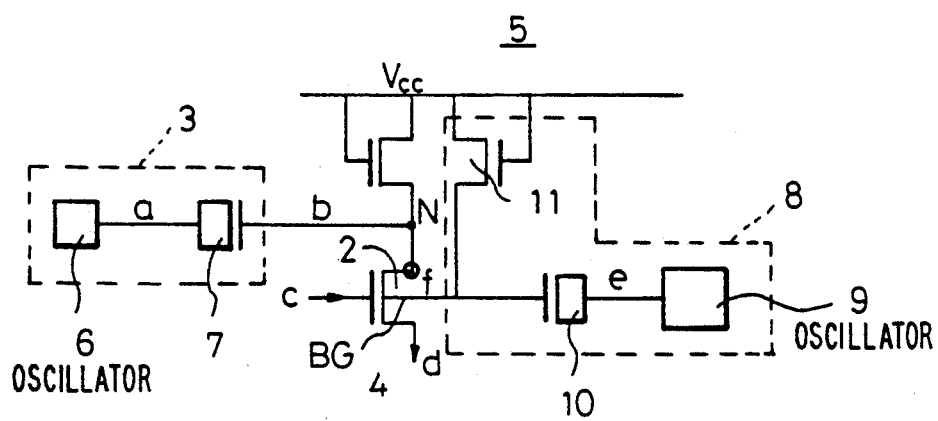
FIG. 1 is a schematic diagram illustrating the principle of a boost circuit in the integrated semiconductor circuit according to the present invention, and, illustrates one embodiment of the integrated semiconductor circuit of the invention.

FIG. 1 illustrate the principle of a substrate potential generating circuit such as a boost circuit 5 employed in the integrated semiconductor circuit according to the present invention. As well, FIG. 1 shows one practical embodiment of the boost circuit 5 of the invention.

The boost circuit 5 of the integrated semiconductor circuit according to the present invention employs a P-channel type transistor 2 as a driver for a boost signal. A charge-up means 8 is provided to charge-up the back gate of the P-channel type transistor 2 to a predetermined level in advance to supply the boost signal to the driver.

Figure 3:
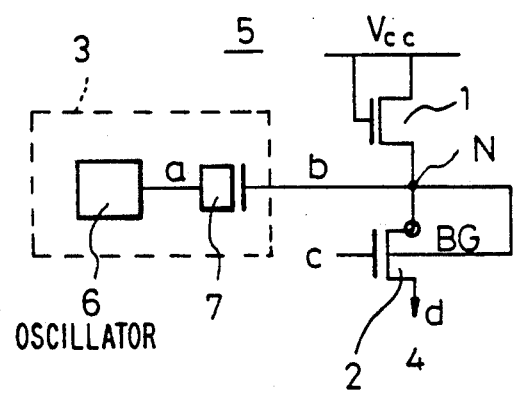
FIG. 3 is a diagrammatic illustration showing one typical embodiment of the conventional boost circuit.
Figure 4:
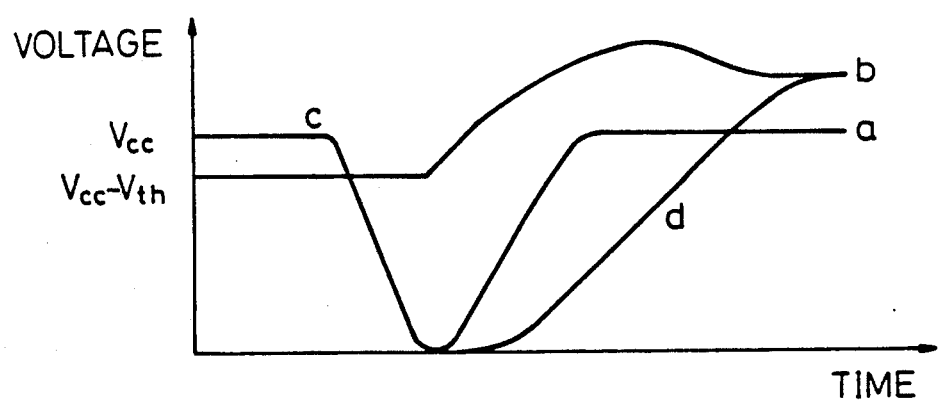
FIG. 4 is a chart showing a waveform in the circuit of FIG. 3.

Namely, the construction of the boost circuit 5 according to the present invention has essentially the same circuit construction as that of the conventional boost circuit 5 in FIG. 3. The boost circuit 5 includes a N-channel type transistor 1 having the drain and the gate connected to a high potential power source, such as Vcc, and a P-channel type transistor 2 having the source connected to the source of the N-channel type transistor 1, the drain d connected to the substrate or an output 4, and the gate connected to an input signal source. The note section N between the N-channel type transistor 1 and the P-channel type transistor 2 is connected to the output of a boost signal generating means 3. According to the present invention, the charge-up means 8 is provided separately from the boost signal generating means 3. The charge-up means 8 charges-up the back gate BG of the P-channel type transistor 2 to a predetermined level before the boost signal is applied to the back gate BG of the P-channel type transistor 2.

The charge-up means 8 for the back gate of the P-channel type transistor 2 may comprise an appropriate oscillation means 9, a capacity 10 and a N-channel type transistor 11, which has the drain and the gate connected to a high potential power source.

The oscillation means 9 may employ a separate power source to the oscillation means 6 of the boost signal generating circuit 3. The potential f of a charge-up signal to be applied to the back gate BG of the P-channel type transistor 2 must be applied at a earlier timing than charge timing of the boost signal b for the node N.

It is also possible for the oscillation means 9 to employ a common power source to the oscillation means 6 of the boost signal generating means 3. In this case, in order to satisfy the condition set forth above, it becomes necessary to design the circuit so that the charge-up signal f may be provided at an earlier phase than the boost signal b.

Figure 2:
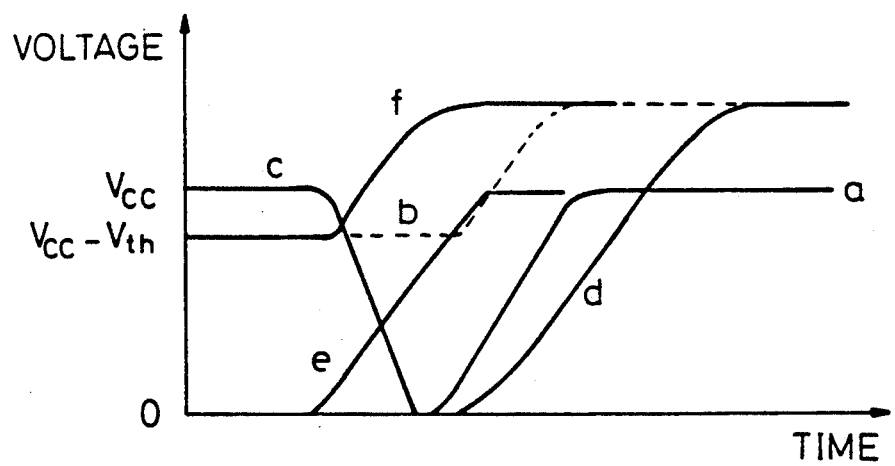
FIG. 2 is a chart showing a waveform in one embodiment of the semiconductor circuit of FIG. 1.

The waveforms at various positions of the above-mentioned embodiment of the present invention are shown in FIG. 2.

At the same time as or after switching the input signal c from "H" level to "L" level for example, the oscillation means 9 of the charge-up means 8 of the present invention, generates a pulse changing level from "L" level to "H" level. The pulse signal thus generated is applied to the back gate BG of the P-channel type transistor 2 at an earlier timing than a charge timing of the boost signal for the node section N. As a result, the potential f at the back gate GB of the P-channel type transistor 2 rises swiftly before the potential b of the node section N starts to rise from the level of Vcc−Vth.

Thereafter, the boost signal a is generated from the boost signal generating means 3. At this time, the boosted signal b is not required to charge the capacity of the back gate. Therefore, at approximately the same timing as the driver to turn ON the P-channel type transistor, the potential d at the substrate 4 rises swiftly to the potential higher than Vcc. This achieves a substantial gain in the boosting speed.

Figure 5:
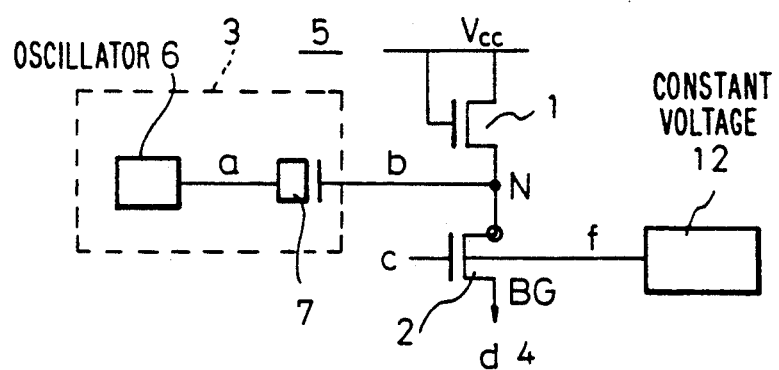
FIG. 5 is a schematic diagram showing another embodiment of the boost circuit according to the present invention.
Figure 6:
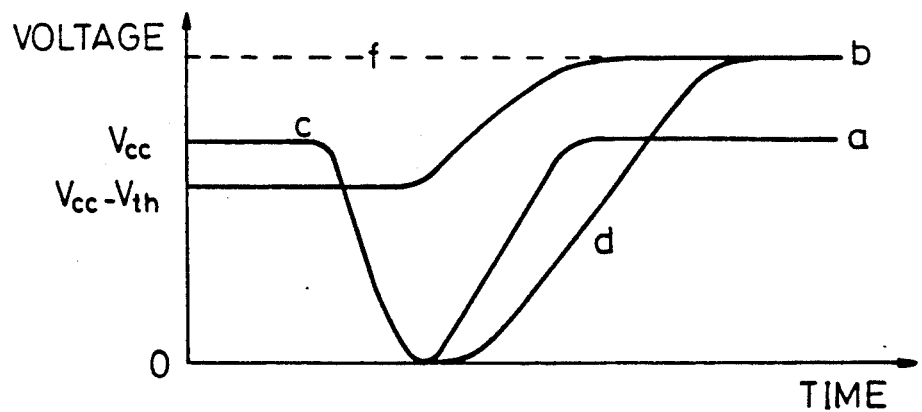
FIG. 6 is a chart showing a waveform in the embodiment of FIG. 5.

FIGS. 5 and 6 shows another embodiment of the integrated semiconductor circuit according to the present invention. The shown embodiment is differentiated from the former embodiment by the employment of a constant voltage source 12 as the charge-up means 8 in place of the construction set forth above.

Namely, in the shown embodiment, a voltage source provided separately to Vcc for the integrated semiconductor circuit: Accordingly, the back gate BG of the P-channel type transistor 2 is constantly applied the predetermined potential f.

As is clear from the waveforms of the shown embodiment in FIG. 6, even in this embodiment, the potential d of the substrate or an output can rise quickly to a level higher than Vcc at approximately the same timing as the rising of the level of the boost signal a, and thus a substantial gain in the speed can be obtained.

Since the present invention employs the constructions set forth above, the load for the boost signal can be significantly reduced. Since the rising speed of the potential in response to the boosted signal is significantly improved, the processing speed of the integrated semiconductor circuit can be raised significantly.

While the present invention has been discussed in terms of the preferred embodiments of the invention, those skilled in the art may implement the principle of the present invention in various fashions including obvious changes, modifications, additions, and omission detailed elements. Therefore, it should be appreciated that the present invention includes all possible embodiments and modifications thereof that can be embodied without departing from the principle of the invention set out in the appended claims.

The characteristic feature of the present invention is such that the processing speed of the integrated circuit can be improved by making use of a separate voltage source from the boost signal generating means to thereby increase the potential level of the back gate of the P-type channel transistor prior to the time when the boost signal is applied to the source of the P-type channel transistor.

In the present invention, the size and performance of the transistor and the boost signal generating circuit are not restricted to a certain level but can be optionally determined depending upon the load of the circuit used.

Further, in the present invention, an oscillator used for charging the back gate of the P-type channel transistor generates any number of frequencies but, for example, it may generates a frequency of about 1MHz and a capacitance of the capacitor used in this charging circuit may be, for example, about several pico-farad and further in this case, the processing speed of the integrated circuit can be improved by about 3 ns, for example.

Moreover, all of the embodiments of the present invention are explained by utilizing MOS FET transistors as components of the boost circuit but bipolar transistors can also be used in the boost circuit of the present invention.

Figure 7:
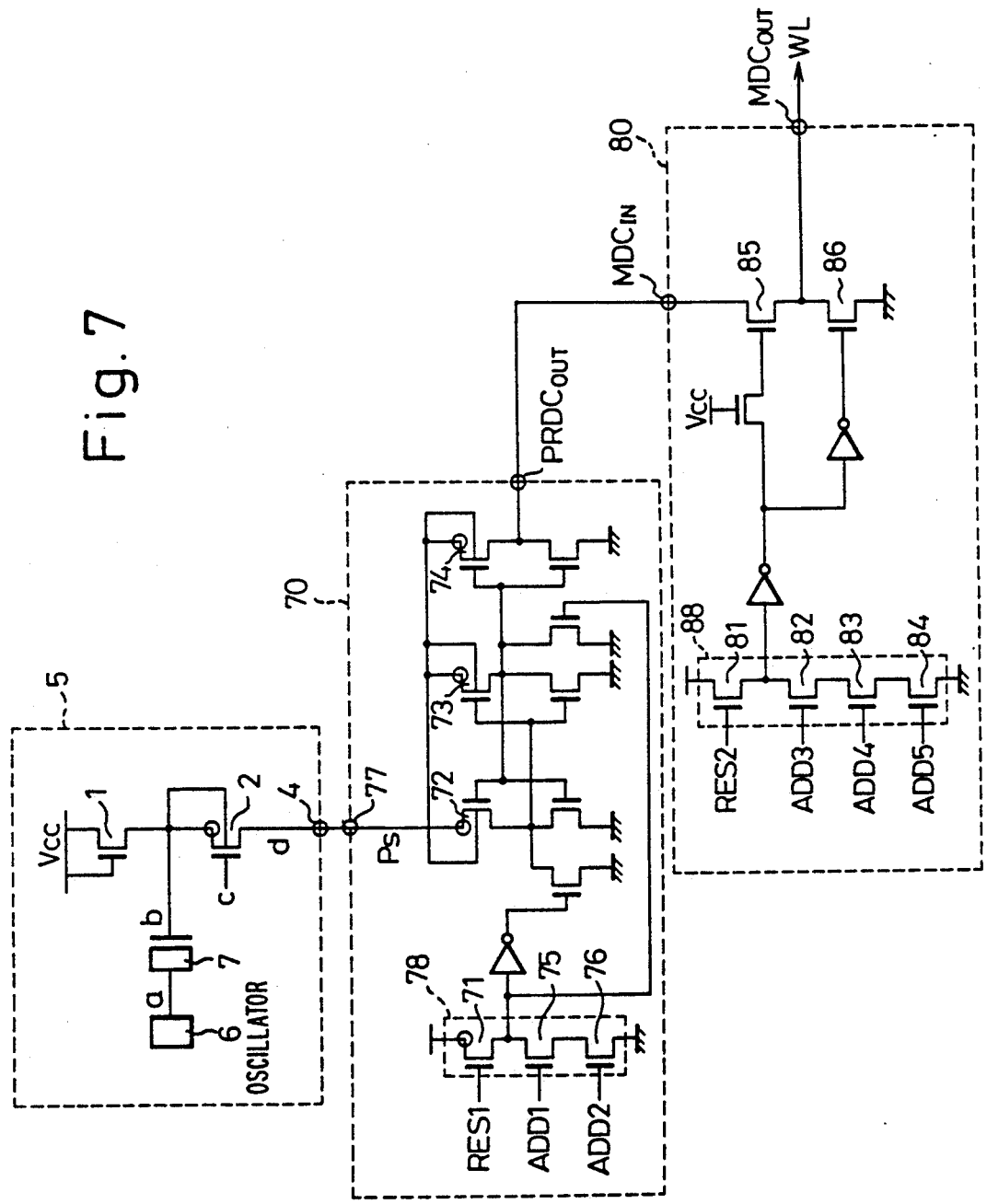
FIG. 7 shows a part of a block diagram of a memory circuit in which a boost circuit of the present invention is used in connection with a predecoder.

FIG. 7 shows one embodiment of a boost circuit used in a memory circuit and shows how the boost circuit can work in the memory circuit.

Note, that FIG. 7 shows one embodiment of a memory circuit in which the conventional boost circuit 5 as shown in FIG. 3 is used and FIG. 7 only shows a part of the memory circuit indicating a connecting relationship among the boost circuit 5, a predecoder 70 and a main decoder 80.

In FIG. 7, the output 4 of the boost circuit 5 is connected to an input 77 of the predecoder 70 formed by a source PS of the P-channel MOST FETs 72 to 74.

Decoding circuit 78 comprising a P-channel MOS FET 71, to a gate of which a reset signal RES1 is applied and N-channel MOS FETs 75 and 76, to each one of base of which respective address signals ADD1 and ADD2 are applied, respectively.

Therefore, when any one of the P-channel MOS FETs 72 to 74 is selected by the decoding circuit 78, the selected P-channel MOS FET is turned ON, the voltage signal output from the output gate 4 of the boost circuit 5 is output from an output PRDC$_{out}$ of the predecoder 70.

The output PRDC$_{OUT}$ of the predecoder 70 is connected to an input MDC1$_{IN}$ and the input MDC$^{IN}$ is connected to a source of N-channel MOS FET 85 serially connected to another N-channel MOS FET 86 which connected to the earth with having an output DC$_{OUT}$ formed at a node portion between both N-channel MOS FETs 85 and 86.

The N-channel MOS FET 85 is controlled by a decoding circuit 88 comprising a P-channel MOS FET 81, to a gate of which, a reset signal RES2 is applied and N-channel MOS FETs 82 to 84, to each one of base of which respective address signals ADD3 to ADD5 are applied, respectively.

Therefore, when the N-channel MOS FET 85 is selected by the decoding circuit 88, the selected N-channel MOS FET is turned ON, the output of the predecoder 70 is output from the output DC$_{OUT}$ of the main decoder 80 which is connected to word line WL.

But as explained above, the output of the convention boost circuit 5 is delayed and deformed and therefore when the convention boost circuit 5 is used as an active pull-up circuit of word, lines WL of in the memory circuit, the rising time of the word lines is delayed due to the deformation of the output wave of the boost circuit whereby the selection time of row lines is naturally delayed to the extent of that delay of the riseing time of the word lines.

Accordingly, in the present invention, the conventional boost circuit 5 as shown in FIG. 7 is substituted by the boost circuit of the present invention as shown in FIG. 1 or 5 to thereby improve the problems as explained above.

Note, that in FIG. 7, there are two decoders between the boost circuit 5 and the word lines WL and therefore, the signal output from the boost circuit 5 is first input to the predecoder 70 and then is transferred to the word lines WL of a cell array through the main decoder.

When a plurality of decoders are provided, the number of decoders can relatively reduced in the case of number of addresses being increased.

And further, in an actual process, the buffer means 6 of the boost circuit 5 comprised a plurality of invertor circuits and to which a clock generator or the like is connected.

In these embodiment, $\overline{RAS}$ signal and $\overline{CAS}$ signal are input to the clock generator and when the timing of both signals shows a good timing for the word lines can be activated, the output signal level of the decoder 80 which has been high level, is changed to low level.

We claim:

1. An integrated semiconductor circuit employing a boost circuit for generating a voltage higher than a high potential power source, said boost circuit comprising:
    a P-channel type transistor as a driver for driving a boosted signal(b) with a boost signal (a); and
    a charge-up means for charging a back gate of said P-channel type transistor to a predetermined level in advance of the application of said boost signal to said P-channel type transistor.

2. An integrated semiconductor circuit as set forth in claim 1, wherein said boost circuit comprises a N-channel type transistor having a gate and a drain connected to said high potential power source, and a source connected to a source of said P-channel type transistor; said P-channel type transistor has a drain connected to a substrate, the back gate to which a signal from said charge-up means to turn ON said P-channel type transistor before boosting is applied, and a gate to which an input signal is applied and the node between said N-channel type transistor and said P-channel type transistor is connected to an output of a boost signal generating means.

3. An integrated semiconductor circuit as set forth in claim 2, wherein said boost signal generating means comprises an oscillation means and a capacitor.

4. An integrated semiconductor circuit as set forth in claim 1, wherein said charge-up means for the back gate of said P-channel type transistor comprises an oscillation means and a capacitor.

5. An integrated semiconductor circuit as set forth in claim 1, wherein said charge-up means for the back gate of said P-channel type transistor comprises a constant voltage source.

6. An integrated semiconductor circuit as set forth in claim 4, wherein said charge-up means further comprises an N-channel type transistor having a drain and a gate connected to the high potential power source and a source connected to the back gate of said P-channel type transistor.

* * * * *